United States Patent [19]
Bidefeld

[11] Patent Number: 5,588,203
[45] Date of Patent: Dec. 31, 1996

[54] NOZZLE FOR A VACUUM MOUNTING HEAD

[75] Inventor: Branko Bidefeld, Marietta, Ga.

[73] Assignee: Matsushita Communication Industrial Corporation of America, Peachtree City, Ga.

[21] Appl. No.: 397,634

[22] Filed: Feb. 28, 1995

[51] Int. Cl.$^6$ ............................ B23P 19/04; H01L 21/68; H05K 13/04
[52] U.S. Cl. ........................ 29/743; 29/DIG. 44; 279/3; 294/64.1; 414/737
[58] Field of Search ........................ 29/740, 741, 743, 29/DIG. 44; 279/3; 414/737; 294/2, 64.1

[56] References Cited

U.S. PATENT DOCUMENTS

| 2,198,765 | 4/1940 | Featherstone et al. | 279/3 X |
| 2,458,302 | 1/1949 | Richardson | 279/3 X |
| 3,681,139 | 8/1972 | Jannett et al. | 279/3 X |
| 4,040,169 | 8/1977 | Rose | 29/743 X |
| 4,587,703 | 5/1986 | Azizi et al. | 414/737 X |
| 4,649,633 | 3/1987 | Bocchiccio et al. | 29/743 X |
| 4,778,326 | 1/1988 | Althouse et al. | 29/743 X |

FOREIGN PATENT DOCUMENTS

| 322589 | 1/1991 | Japan | 29/743 |
| 4264751 | 9/1992 | Japan | 279/3 |
| 4256400 | 9/1992 | Japan | 29/743 |
| 594943 | 4/1993 | Japan | 279/3 |
| 2149697 | 6/1975 | United Kingdom | 279/3 |

Primary Examiner—Peter Vo
Attorney, Agent, or Firm—Jones & Askew

[57] ABSTRACT

A nozzle for a vacuum mounting head of a component placement machine. The nozzle includes a positioning block defining a plurality of spaced apart pads on top of the block with each of the pads having a pad hole in the top of the pad. The positioning block also defines an opening in the bottom of the block for mounting the nozzle on the vacuum mounting head. The positioning block further defines an interior air passage connecting each of the pad holes with the opening in the bottom of the block for the application of a vacuum force by the nozzle.

17 Claims, 3 Drawing Sheets

NOZZLE FOR A VACUUM MOUNTING HEAD

TECHNICAL FIELD

The present invention relates to nozzles for use with vacuum mounting heads, and in particular, relates to nozzles for use with vacuum mounting heads on computer chip placement machines.

BACKGROUND OF THE INVENTION

Advances in the field of electronic devices have led to a concomitant rise in consumer demand for good quality, but inexpensive electronic devices. In particular, the popularity of cellular telephones has increased sharply in response to the improvement in quality of cellular communications and to the reduction in the cost of cellular telephones and their use. In seeking to meet customer demand, manufacturers have sought to produce quality electronic devices in a more efficient and economical manner. To meet and beat the competition, manufacturers have sought to produce quality electronic devices more quickly and less expensively.

With respect to consumer electronic devices, such as cellular telephones, one of the principal problems faced by a manufacturer is the efficient and economical manner of assembly of such devices. Assembly of an electronic device such as a cellular telephone requires the assembly and connection of components such as computer chips onto a printed circuit board. During the research and development of a particular electronic device, the components may be assembled and connected onto a printed circuit board partially or completely by hand. However, large scale production of the electronic device requires a method of circuit board assembly and connection that is quicker than hand assembly, that is higher in quality, and that is more economical.

Prior art systems have turned to automation for circuit board assembly and connection. One particular prior art system is an automatic pick and place machine (also referred to as a "chip mounter", a "chip placement machine", or generally as a "component placement machine"). An example of an automatic pick and place machine is the PANASERT MPA 40 and similar equipment manufactured by Matsushita, Inc., Seike Division, Japan. Comparable pick and place machines are available from other manufacturers. A pick and place machine includes a motorized conveyor belt for delivery of an empty or nearly empty circuit board to a component assembly location. After assembly, the conveyor belt transports the circuit board away from the component assembly location to the next station in the assembly of the electronic device. At the component assembly location, the pick and place machine assembles and connects most of the necessary components onto a circuit board pursuant to a computer program that provides directions for the selection and placement of each component onto the circuit board. Generally, the pick and place machine uses a vacuum mounting head to pick up a component and then to connect it in a particular position on the circuit board. A pick and place machine may use more than one vacuum mounting head in the assembly of the components on the circuit board.

In a pick and place machine, each vacuum mounting head includes a nozzle that directs a vacuum force for picking up a component, holding the component during transport to the component's position on the circuit board, and placing the component in position on the board. A common prior art nozzle is a nozzle that is generally needle shaped in appearance with a hole at the distal end of the needle for application of the vacuum force to pick up and hold each component. Through use of a needle-like nozzle on a vacuum mounting head, a pick and place machine is able to assemble and connect small, light and substantially flat-topped components on a circuit board. Other components have had to be assembled and connected by hand.

As noted above, a prior art needle-like nozzle is able generally to assemble and connect only small, light and substantially flat-topped components. A needle-like nozzle has difficulties in picking up, transporting and positioning large and/or wafer-like components because the disproportionate size of a large and/or wafer-like component with respect to the area of the needle hole does not allow for sufficient vacuum force to be delivered across a large enough surface area to accommodate the large size and/or wafer-like shape of the component. Similarly, a needle-like nozzle has difficulties in picking up, transporting and positioning relatively heavy components because the weight of these components is too much with respect to the vacuum force that the needle-like nozzle directs through its needle hole. In addition, a needle-like nozzle has difficulties in picking up, transporting and positioning components that are not substantially flat-topped because the needle hole is unable to achieve a good vacuum seal with such a component and the vacuum force is lessened, thereby causing difficulties in the handling of the component.

As a result of the inability to properly handle certain components, a vacuum mounting head with a needle-like nozzle may miss certain components during pick up procedures necessitating the repetition of the pick up procedures for that component. Also, the needle-like nozzle may drop a component during transport of the component necessitating the repetition of the pick up and transport procedures for that component. In addition, the needle-like nozzle may misplace a component necessitating the repetition of the pick up, transport and placement procedures. Missing a component on pick up, dropping a component or misplacing the component may bend or break the component and destroy its usefulness. In addition, dropping a component on the circuit board or misplacing a component on the board may destroy the usefulness of other components already placed on the board or the board itself.

Solutions to these problems with needle-like nozzles in vacuum mounting heads have been attempted. One solution has been to increase the size of the hole in the needle-like nozzle. An increase in the needle hole may ameliorate some of the pick up, transport and placement problems, but fails to address other problems such as the problem in picking up, transporting and placing components that are not substantially flat-topped. In addition, an increase in the needle hole adds at least an additional problem in that a nozzle with a large needle hole would be unable to pick up very small components. These components would be sucked up entirely into the nozzle causing a jam in the nozzle, and otherwise negatively affecting the assembly of the electronic device.

Another solution to these assembly problems has been to customize the configuration of a pick and place machine to the particular electronic device that is assembled by the machine. In a customized machine, the mounting heads are specially customized to handle the variety of components used in the particular electronic device. These mounting heads may include vacuum mounting heads, but also may include heads that mount components by other means such as robotic arms or centering fingers. Obviously, a customized pick and place machine is a significant investment for a manufacturer. Further, a customized pick and place machine takes time to develop and build, and this development time slows down the time table for production of the electronic devices. Given the changes that must be made regularly to an electronic device to accommodate technological advances and consumer tastes, the expense and time delays associated with a customized pick and place machine may not be justified.

As a result of the problems with prior art pick and place machines using needle-like nozzles and the expense and time delays associated with customized pick and place machines, manufacturers have employed workers to position certain components on a circuit board of an electronic device. For example, a manufacturer may use a pick and place machine to place the majority of components on a circuit board, and then employ personnel to place large, wafer-like, heavy or odd shaped components on the board by hand.

Such use of personnel to hand place certain components on a circuit board has significant drawbacks. One of the principal drawbacks of the hand method is the time delay that is introduced into the assembly of the electronic device. The whole assembly fine is held up by at least the length of time the worker takes to position a component by hand. Even a very skilled worker cannot pick up, transport and position a component as quickly as the slowest pick and place machine. Another drawback of the hand method is the diminishment in quality with respect to the placement and connection of the component. The overall quality of component placement suffers when done by hand because even a skilled worker is unable to consistently position a component in the best possible position. Further, hand placement results in an increase in the number of broken and damaged components and circuit boards. Another significant drawback is the reduction in the work force that would otherwise be available for more sophisticated work, but for the necessity of using personnel in the hand work of positioning certain components on the circuit boards during the assembly of electronic devices. This work force could be put to use in a more skilled, productive and self-satisfying area.

In sum, the inability of prior art vacuum mounting heads of pick and placement machines to pick up, transport and place certain components on a circuit board during the assembly of electronic devices results in the following problems: breakage of certain components and circuit boards; time delays in the assembly of the electronic devices; increased labor costs; diminished and inconsistent quality of the assembled electronic devices; and time delays and expensive investments associated with customized machines.

Accordingly, there is a need for a simple, inexpensive nozzle for use with vacuum mounting heads in pick and place machines that provides for the pick up, transport and positioning of components, and especially of components that may be large, wafer-like in shape, relatively heavy, or non-flat topped on a circuit board of an electronic device.

SUMMARY OF THE INVENTION

As will be seen, the present invention satisfies the foregoing criteria. Stated generally, the present invention is a nozzle for a vacuum mounting head of a component placement machine. The nozzle includes a positioning block that defines a plurality of spaced aparts pads on top of the block. Each of the pads has a pad hole in the top of the block. The positioning block also defines an opening in the bottom of the block for use in connection of the block to the mounting head of the component placement machine. Further, the positioning block defines an interior air passage that connects each of the pad holes with the opening in the bottom of the block. Thus, the nozzle may be placed on the mounting head by means of the opening in the bottom of the block. The nozzle directs an applied vacuum force by means of the opening in the bottom of the block and the interior air passages in the block that are connected to the holes in the top of the pads.

Stated more specifically, the preferred embodiment of the present invention is a nozzle for a vacuum mounting head of a component placement machine that includes a positioning block with a top, a bottom and a first side substantially perpendicular to the top and the bottom. The top of the block of the preferred nozzle defines a plurality of spaced apart pads, and in particular, defines three spaced apart pads. Each of the pads in the preferred nozzle has three sides with each of the three sides being substantially perpendicular to the top of the block. In addition, each of the pads in the preferred nozzle has two sides that are substantially equal in area, and a third side that is in the same plane as the first side of the positioning block. In other words, the preferred nozzle includes three spaced apart pads that are generally oriented in the same direction with each pad being shaped generally like a triangle with some height. Further, each of the pads in the preferred nozzle has a substantially flat top with a hole in the flat top.

The preferred nozzle also includes a shank connected to the bottom of the positioning block for mounting the nozzle on the vacuum mounting head. The shank has a hollow bore. In addition, the preferred nozzle includes an air passage that is defined within the positioning block and that connects each of the pad holes with the hollow bore of the shank. Preferably, the air passage has a cross section of a particular area at the intersection of the air passage and one of the pad holes. The area of the air passage cross section is less than the cross section of the area of one of the pad holes at that intersection in the preferred embodiment. Thus, the preferred nozzle may be placed on the vacuum mounting head by means of the opening in the bottom of the positioning block. The nozzle directs an applied vacuum force by means of the opening in the bottom of the block and the interior air passages in the block that are connected to the holes in the top of the pads.

Stated even more specifically, the positioning block, the pads and the shank are integrally formed in the preferred nozzle. Preferably, the shank also has a keyway disposed in the outside of the shank parallel to the longitudinal axis of the shank to accept a key to prevent rotation of the shank and to limit the stroke of the vacuum mounting head. Further, in the preferred embodiment, the cross section of the air passage at the intersection of the air passage and a pad hole is round with a particular diameter. The cross section of the pad hole is preferably oval with at least one diameter (also referred to as an axis) greater than the particular diameter of the air passage cross section. In this way, the preferred nozzle directs a vacuum force through pad holes that in cross section, each have a greater area than the cross section of the air passage to which each pad hole is connected.

Advantageously, the nozzle of the present invention is able to pick up, transport and position components on a circuit board of an electronic device. In particular, the nozzle of the present invention is able to pick up, transport and position components that may be large, wafer-like in shape, relatively heavy, or non-flat topped on a circuit board of an electronic device. The nozzle of the present invention overcomes the failings of the prior art in a non-obvious fashion through the use of a positioning block with a plurality of spaced apart pads on top of the positioning block and through the use of the pad holes that are connected through the air passages of the positioning block to the hollow bore of the shank.

Therefore, it is an object of the present invention to provide an improved nozzle for a vacuum mounting head of a component placement machine.

It is also an object of the present invention to provide a nozzle that is able to pick up, transport and position components on a circuit board, and in particular, components that are large, wafer-like in shape, relatively heavy, or non-flat topped.

It is an additional object of the present invention to provide a nozzle that is able to pick up, transport and position components on a circuit board in a quick, efficient and economical manner.

It is a further object of the present invention to provide a nozzle for use with conventional vacuum mounting heads on conventional pick and place machines.

It is also an object of the present invention to provide a nozzle that is able to pick up, transport and position components on a circuit board so that hand labor in electronic device assembly is minimized.

That the present invention satisfies these objects, and overcomes the drawbacks of the prior art set forth will become apparent from the detailed description of the preferred embodiment to follow.

DETAILED DESCRIPTION

Figure 1:
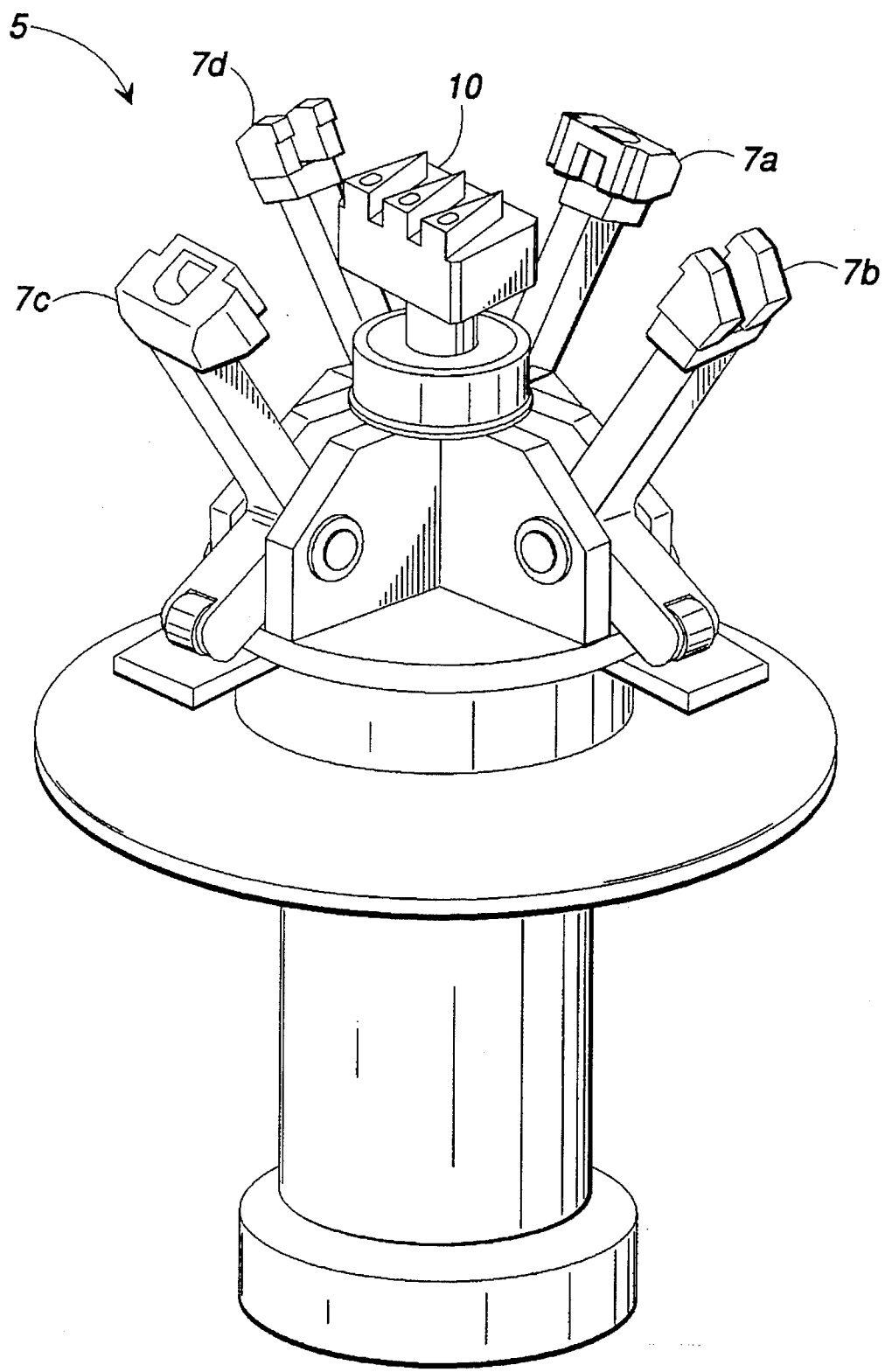
FIG. 1 is a perspective view of the preferred nozzle in position on a vacuum mounting head of a pick and place machine.

Referring now to the drawings, in which like numerals indicate like elements throughout the several figures, FIG. 1 is a perspective view of a typical vacuum mounting head 5 of a pick and place machine. In particular, FIG. 1 illustrates a vacuum mounting head of a pick and place machine known as the PANASERT MPA 40, manufactured and sold by Matsushita, Inc., Seike Division, Japan. Very similar (if not identical) heads appear on other PANASERT MPA machines, and similar heads appear on other pick and place machines. The vacuum mounting head 5 includes four centering fingers 7a–d that are retractable. The centering fingers 7a–d are mounted in opposing pairs with each pair disposed at substantially 90 degrees to the other pair. As will be appreciated by those skilled in the art, the four centering fingers 7a–d are shown in their "open" position which is a retracted position away from the center axis of the vacuum mounting head 5. The fingers 7a–d are in this "open" position until a component has been picked up, and then the fingers move to a "closed" position towards the central axis of the vacuum mounting head 5. As the fingers 7a–d move towards their "closed" position, the fingers center the component and provide it with additional stability during transport to the component's position on the circuit board. The fingers 7a–d move back to the "open" position in order to place the component on the circuit board and to move to pick up the next component.

As illustrated in FIG. 1, the vacuum mounting head 5 also includes the preferred nozzle 10 of the present invention. The nozzle 10 is mounted in a conventional manner on a standard nozzle extension (not shown) that is centered about the central axis of the vacuum mounting head and centered within the four centering fingers 7a–d described above. One of the advantages of the nozzle of the present invention is that it is readily mounted on standard nozzle extensions of conventional vacuum mounting heads of typical pick and place machines. Although FIG. 1 illustrates that the preferred nozzle 10 is mounted on a standard vacuum mounting head nozzle extension, it will be understood that the nozzle of the present invention may be mounted in other equivalent ways well known to those skilled in the art and on other vacuum mounting heads.

Figure 2:
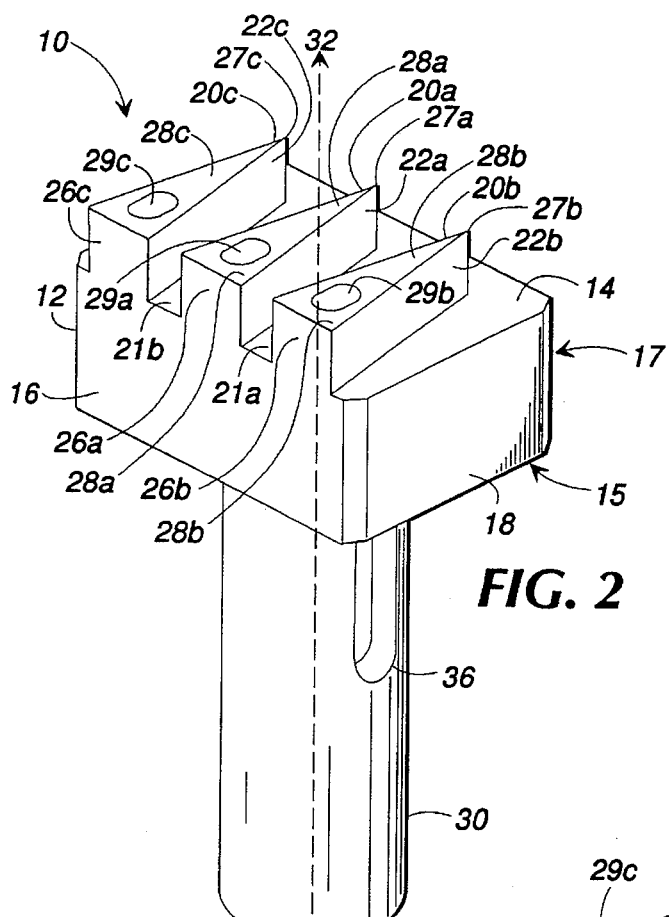
FIG. 2 is a perspective view of the preferred nozzle.

FIG. 2 is a perspective view of the preferred nozzle 10. Generally, the preferred nozzle 10 comprises a positioning block 12 that is defined by a top 14 and a bottom 15. Preferably, the four sides 16–19 of the positioning block 12 are set at right angles with respect to the top 14 and the bottom 15. In addition, the four sides of the preferred positioning block 12 generally define a rectangle with rounded corners having a first side 16 opposite to a second side 17, a third side 18 opposite to a fourth side 19. The first side 16 and the second side 17 are preferably disposed generally at right angles with respect to the third side 18 and the fourth side 19. Although the preferred nozzle 10 has been described as comprising a positioning block with a top, bottom and four sides substantially perpendicular to the top and bottom, the nozzle of the present invention instead may comprise a positioning block having a generally different shape such as a hemisphere or sphere.

Also as illustrated in FIG. 2, the top 14 of the positioning block 12 further defines a plurality of spaced apart pads 20a–c. In the preferred nozzle, the block 12 defines three pads 20a–c with the three pads positioned such that they are distributed across the top of the block from the third side 18 to the fourth side. 19. Advantageously, the distribution of the pads across the top of the block provides for distributed contact with a component. This distributed contact provides for easier pick up of the component, greater stability in the transport of the component, and more accurate placement of the component on a circuit board.

In particular, in the preferred nozzle, the three pads 20a–c are positioned on top of the block such that the first pad 20a is approximately centered between the third side 18 and fourth side 19 of the top 14, the second pad 20b is positioned between the first pad 20a and the third side 18, and the third pad 20c is positioned between the first pad 20a and the fourth side 19. Preferably, the second pad 20b is centered between the first pad 20a and the third side 18 of the positioning block 12. Further, the second pad 20b is separated from the first pad 20a by a first space 21a. Similarly, the third pad 20c is centered between the first pad 20a and the fourth side 19 of the positioning block 12. The third pad 20c also is separated from the first pad 20a, but by a second space 21b. Preferably, the first space 21a and the second space 21b are the same size such that the second pad 20b is the separated by the same distance from the first pad 20a as the third pad 20c.

Advantageously, the spaces 21a–b between the pads 20a–c allow the nozzle 10 to pick up, transfer and place components on a circuit board that prior art nozzles have been unable to successfully pick up, transfer and place. The spaces 21a–b allow the pads 20a–c to be positioned around or between protrusions, wells or other configurations on the surface area of a component such that the pads are in good contact with the component and such that a good seal may be effected between the nozzle and the component so as to maximize the vacuum force directed by the nozzle. Good contact with a component and maximization of the vacuum force makes it easier to pick up, transfer and place a component. An example of the effectiveness of the spaced apart pads of the present invention in picking up, transferring and placing a component on a circuit board is described below in connection with FIG. 4. The present invention has been described in terms of a symmetrical distribution of the pads on the positioning block, but other suitable distributions of the pads will be readily apparent to those skilled in the art.

In the preferred nozzle, each of the pads 20a–c is shaped generally as a wedge having three sides. Each of the three sides is preferably positioned substantially perpendicular to the top 14 of the block 12. The two diagonal sides 22a–c, 24a–c of each pad 20a–c in the preferred nozzle are substantially equal in area. Each of the two sides of equal area 22a–c, 24a–c is positioned preferably parallel to its corresponding side of equal area on the other two pads. Thus, side 22a is positioned in parallel to side 22b and side 22c; side 22b is positioned in parallel to side 22a and side 22c; and side 22c is positioned in parallel to side 22a and side 22b. The same may be said with respect to sides 24a–c. As a result of the parallel positioning of the respective diagonal sides 22a–c, 24a–c of each pad, all three pads are positioned preferably in parallel with respect to each other.

As to the third side 26a–c (also referred to as the base side) of each pad 20a–c, each third side 26a–c is preferably positioned such that it is in the same vertical plane as the first side 18 of the positioning block 12.

In sum, the preferred positioning block 12 includes three spaced apart pads 20a–c that are wedge shaped generally as isosceles triangles. Each triangular pad 20a–c has a base side 26a–c that is disposed in substantially the same vertical plane as the first side 18 of the positioning block 12. Each triangular pad 20a–c also has an apex 27a–c where the equal sides 22a–c, 24a–c of each pad meet at a position that is opposite to the midpoint of the base side 26a–c of each pad. Preferably, each triangular pad 20a–c is sized so that it extends from its base side 26a–c aligned with the first side 18 of the positioning block 12, across the top 14 of the positioning block 12 nearly to the second side 17 of the positioning block 12. Thus, the pads 20a–c occupy approximately fifty percent of the surface area of the top 14 of the positioning block 12 of the preferred nozzle 10.

As will be clear to those of skill in the art, the preferred nozzle 10 has been described to include three triangularly shaped pads 20a–c, but the nozzle of the present invention may include more or fewer pads. Also, the nozzle may include pad(s) that are shaped differently from the triangles of the preferred nozzle. In particular, the pads may be cylindrical or square. In addition, if a nozzle has more than one pad, each of the pads may be of a different shape from the other pad(s) on the positioning block. Further, the orientation of each pad on the positioning block may differ from the orientation of any other pad on the block. Also, the size of each pad may vary with respect to the other pads, and with respect to the surface area of the top 14 of the positioning block 12.

As further illustrated in FIG. 2, each of the pads 20a–c of the preferred nozzle 10 has a substantially flat top 28a–c. Advantageously, the flat top provides the preferred nozzle with greater contact over the surface area of a component that is to be picked up, transported and positioned by the vacuum mounting head 5 than contact provided by prior art nozzles. This greater contact provides for easier pick up of a component, greater stability in the transport of the component, and more accurate placement of the component. Another advantage of the flat top is that it allows for a better seal to be effected between the nozzle of the present invention and the contact area of a component than prior art nozzles. In particular, the flat top allows for a better seal to be effected between each pad of the nozzle of the present invention and the corresponding contact areas of a component. A good seal allows for application of the maximum vacuum force provided by the vacuum mounting head without loss or only minimal loss of such applied force. In other words, a good seal makes it easier for the nozzle to pick up a component, to transport it without dropping it or having it wobble out of position during transport, and to place the component properly on the circuit board.

In addition, as illustrated in FIG. 2, each of the pads 20a–c of the positioning block 12 of the nozzle 10 includes a pad hole 29a–c. The preferred pad holes 29a–c are generally oval in shape with the largest diameter (also referred to as the "largest axis" or "major axis") of the oval oriented in parallel to the third side 18 and fourth side 19 of the positioning block 12. Consequently, the smallest diameter (also referred to as the "smallest axis" or "minor axis") of the oval is oriented perpendicular to the third side 18 and fourth side 19 of the positioning block 12. Also in the preferred embodiment, each of the pad holes 29a–c is sized to be approximately one-third the area of its respective pad 20a–c. However, it will be apparent to those skilled in the art that a pad hole may be of a different shape, and of a different size with respect to the pad than the pad holes of the preferred embodiment. For example, the shape and size of a pad hole may be different to account for a particular component's size, shape and weight. Therefore, the preferred hole's size ratio could vary particularly if a component is of an odd shape. As will be clear to those of skill in the art, each of the pad holes may be of a different shape from the other pad hole(s) on the positioning block. Further, in the preferred embodiment, each pad hole 29a–c has a depth of approximately one-third the height of its respective pad 20a–c. However, it will be apparent to those skilled in the art that a pad hole may have a different depth to account for a particular component's size, shape and weight.

Given the preferred distribution of the pads 20a–c generally across the top 14 of the positioning block 12 from the third side 18 to the fourth side 19, the pad holes 29a–c also are distributed across the top 14 of the block 12. The use of more than one pad and associated pad hole in the preferred nozzle and the distribution of these pads across the top of the positioning block of the nozzle endows the nozzle of the present invention with several advantages over the prior art. The pads provide for greater distribution of contact over a surface area of a component that is to be picked up, transported and positioned by the vacuum mounting head. This greater distribution of contact provides for easier pick up, greater stability in transport, and more accurate placement of the component. Similarly, the pad holes provide for the application of the vacuum force over a greater surface area of the component than prior art nozzles. The application of the vacuum force over a greater surface area of a component through the pad holes also makes for easier pick up, greater stability in transport, and more accurate placement of the component.

As noted, the pad holes 29a–c of the preferred nozzle 10 are substantially oval in shape, rather than round. As noted, the orientation of each oval pad hole 29a–c is such that the larger diameter of the oval is parallel to the third side 18 and fourth side 19. This oval shape has the advantage that it provides for a greater distribution of the vacuum force over the surface area of a component than a round hole, thereby making it even easier for the nozzle to pick up, transport and position a component. The oval shape also has the advantage that it provides for a distribution of the vacuum force closer to the center of a particular component. However, pad holes may be of other shapes including squares or circles. In addition, each pad hole may be of a different shape than the other pad hole(s) of the nozzle.

As further illustrated in FIG. 2, the preferred nozzle 10 also includes a shank 30 connected to the bottom 16 of the positioning block 12 for mounting the nozzle 10 on the vacuum mounting head 5. In the preferred nozzle, the shank 30 is shaped generally as a cylinder and has a longitudinal axis 32. Further, the shank 30 has a hollow bore 34 (see FIG. 3). The hollow bore 34 of the shank 30 is achieved preferably by drilling the interior of the shank 30 along its central longitudinal axis. Preferably, the shank 30 also has a keyway 36 disposed in the outerside of the shank 30 parallel to the longitudinal axis 32 of the shank 30 to accept a key associated with the vacuum mounting head 5 to prevent rotation of the shank 30 and to limit the stroke of the nozzle 10 in a manner well known to those skilled in the art.

Figure 3:
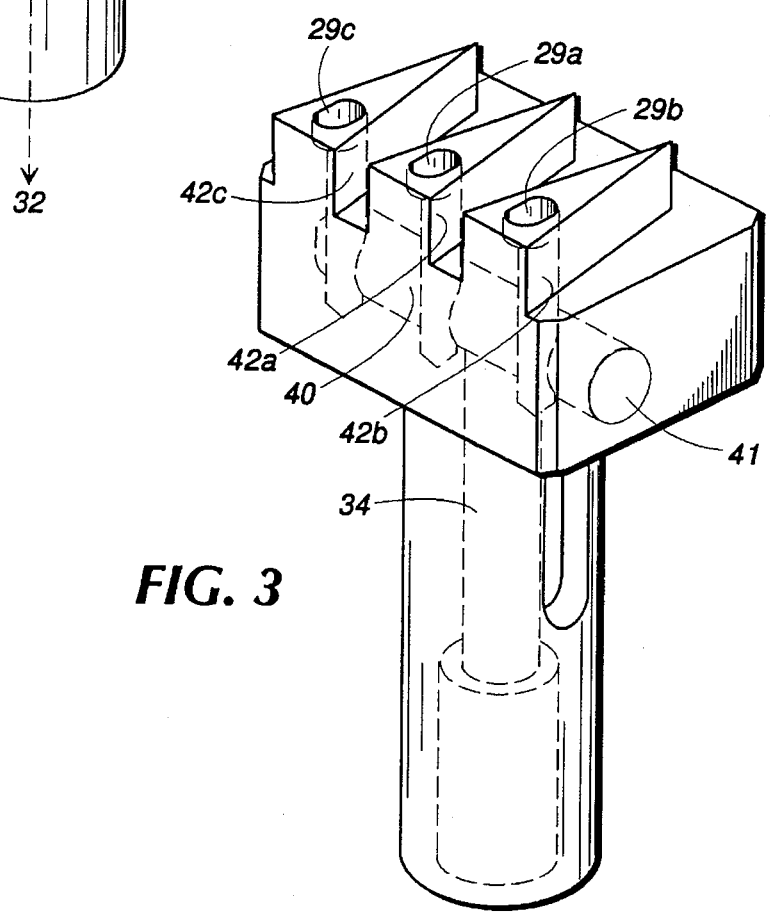
FIG. 3 is the perspective view of the preferred nozzle of FIG. 2 with additional details.

FIG. 3 is the perspective view of the preferred nozzle of FIG. 2, but includes dashed lines indicating the interior air passage 40 of the positioning block 12. The air passage 40 connects each of the pad holes 29a–c with the opening in the bottom of the positioning block 12 and with the hollow bore 34 of the shank 30. In particular, the air passage 40 is preferably a generally cylindrical bore that intersects and extends generally perpendicular to the central axis 32 of the hollow bore 34 of the shank 30. Through this air passage 40, the nozzle 10 directs the vacuum force to pick up, transport and position a component on a circuit board.

As illustrated in FIG. 3, in the preferred embodiment, the air passage 40 extends from a point near the third side 18 of the positioning block 12 through the interior of the positioning block nearly to the fourth side 19 of the positioning block 12. The air passage 40 is formed preferably by drilling the cylindrical bore into the positioning block 12 from one side such as the third side 18. The drill hole 41 made in the third side 18 by drilling the air passage 40 preferably is plugged in a manner well known to those skilled in the art with an aluminum plug to prevent the escape of air through the drill hole 41. As shown in the preferred embodiment, the air passage 40 includes cylindrical extensions 42a–c to connect the cylindrical bore of the air passage 40 to the pad holes 29a–c. However, it will be apparent to those skilled in the art that such extensions 42a–c will not be necessary in all embodiments of the present invention, and that in some embodiments the pad holes 29a–c will be directly connected to the main body of the air passage 40.

As further illustrated in FIG. 3, in the preferred nozzle, each cylindrical extension 42a–c of the air passage 40 has a cross section of a particular circular area. Also, each pad hole 29a–c has a cross section preferably of an oval area. Further it will be noted that each cylindrical extension 42a–c preferably intersects a pad hole 29a–c. At this intersection, the area of the circular cross section of the cylindrical extensions 42a–c of the air passage 40 preferably is less than the area of the oval cross section of the associated pad hole. In other words, the opening of the air passage at the point it intersects a pad hole is smaller than the opening of the pad hole. Advantageously, this feature of the preferred nozzle 10 provides that the pad holes 29a–c direct the vacuum force over a relatively greater area of the surface of a component than prior art nozzles. Although the preferred embodiment has been described to include a cylindrical bore and cylindrical extensions for the air passage 40 and ovoid pad holes, it will be appreciated that the configuration of the air passage may assume other shapes.

Preferably, the positioning block 12, pads 20 and shank 30 are formed integrally in that a piece of suitable material is machined to render these elements of the nozzle as a single piece. The preferred nozzle is machined from air hardened steel (A2) in a manner well known to those skilled in the art. However, other suitable materials will be apparent to those skilled in the art.

Figure 4:
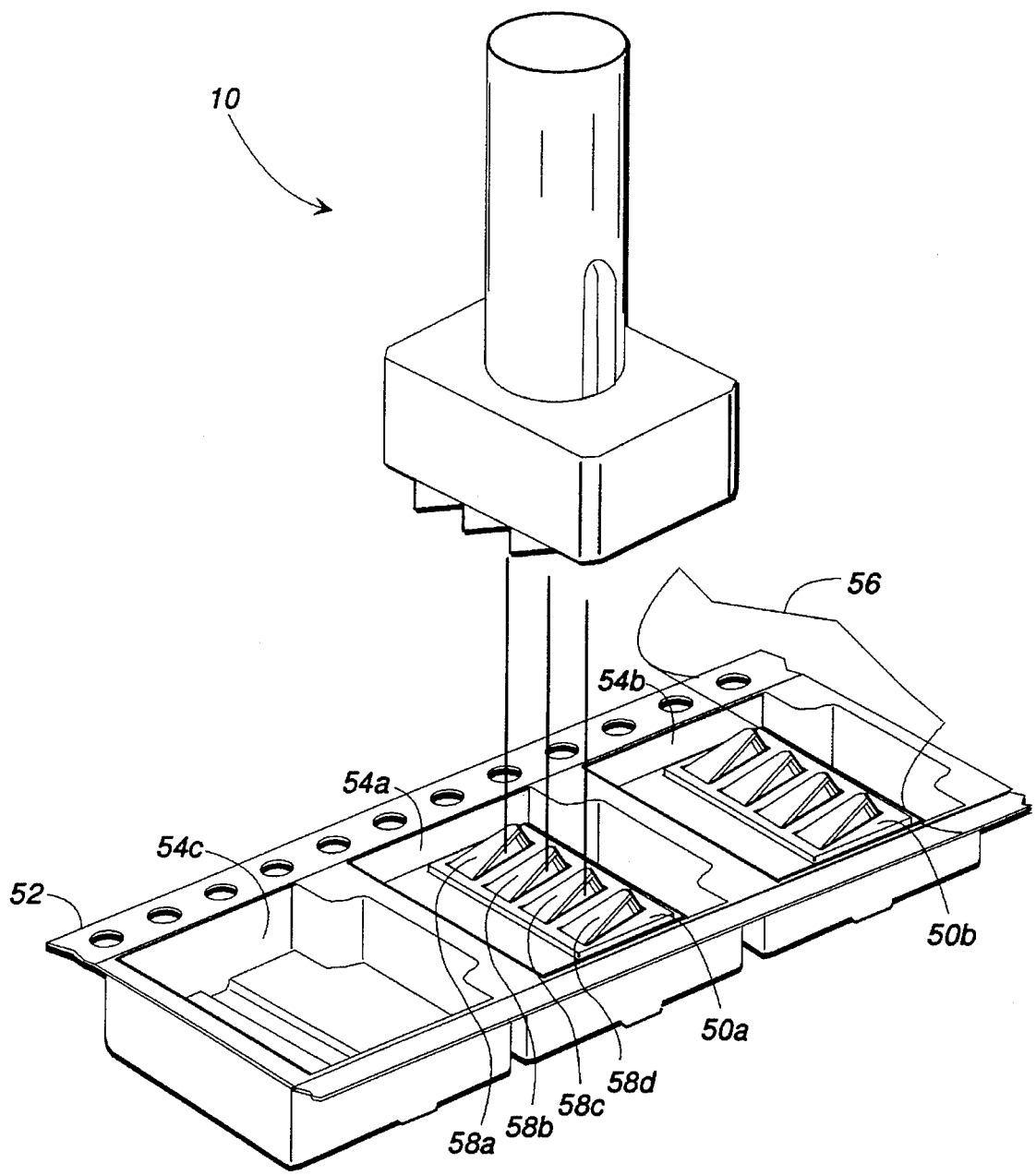
FIG. 4 is a perspective view of the preferred nozzle with respect to pick up of a component from a tape of components.

FIG. 4 is a perspective view of the preferred nozzle 10 with respect to pick up of a component 50a from a tape 52 of components. As noted above in the background, a pick and place machine uses a vacuum mounting head to mount a relatively large variety and number of components onto a circuit board of an electronic device. Typically, all of the components of a particular type are arrayed on a single component tape that is spooled and positioned in the assembly area. Thus, an assembly area will include a plurality of spooled tapes with a spooled tape for nearly all of the types of component that are to be mounted on the circuit board. Each spooled component tape is mounted in such a fashion that the tape unwinds to allow the vacuum mounting head to pick up a component from the tape.

FIG. 4 illustrates a segment of a spooled component tape 52 at the point of pick up by the preferred nozzle 10. The illustrated tape 52 includes pockets to house individual components. These pockets organize and protect the components from damage or mishandling. In particular, the illustrated segment of the tape 52 includes three pockets 54a–c with a component in two of the pockets. The illustrated tape 52 is configured specifically to house battery connectors in its pockets. The specific configuration of the pockets allows each battery connector to be housed relatively securely and accurately, but to be easily picked up out of the pocket. Spooled component tapes such as the illustrated tape 52 may be obtained from 3M Corporation, Minneapolis, Minn.

As noted, the illustrated segment of tape 52 includes three pockets 54a–c. The pocket 54a includes a battery connector 50a that is about to be picked up by the preferred nozzle 10. The pocket 54b includes the battery connector 50b that will be the next battery connector to be picked up by preferred nozzle. The pocket 54c is empty. It contained the previous battery connector picked up by the preferred nozzle. In operation, the preferred nozzle picked up the battery connector that was disposed in pocket 54c, and while the preferred nozzle transported and placed that battery connector, the tape 52 unwound to properly position the battery connector 50a in pocket 54a for the next pick up by the preferred nozzle. The illustrated embodiment of the tape 52 also includes a tape cover 56 that covers the pockets of the tape prior to component pick up. The tape cover 56 prevents the components from falling out of their respective pockets and also protects the components from damage or mishandling. The tape cover 56 is peeled back in a manner well known to those skilled in the art to "open" a pocket and allow the component in the pocket to be picked up by the nozzle. FIG. 4 illustrates a portion of the tape cover 56 in its peeled back position.

As noted in the background, one of the problems with prior art nozzles has been the difficulty in picking up, transporting and positioning components that are not substantially flat-topped. A particular problem with components that are not substantially flat-topped is that the main body of the component sits relatively deeply within the pocket of the spooled component tape. The topographical features of such a component stick up to interfere with the nozzle of the vacuum mounting head. The non-flat top of such a component prevents a prior art nozzle from achieving a good vacuum seal with the component, thereby lessening the vacuum force applied to the component and generally causing difficulties in the handling of the component. Typically, prior art nozzles are unable to pick up such components. Alternatively, prior art nozzles damage or break the topographical features of the component in the process of attempting to pick up the component.

The battery connector 50a illustrated in FIG. 4 is an example of a component with topographical features that pose a significant problem for prior art nozzles. In particular, the battery connector 50a includes four terminals 58a–d that stick up out of the main body of the battery connector 50a. These terminals 58a–d are relatively fragile. Care must be taken to avoid mounting a battery connector with a damaged or broken terminal on a circuit board because such mounting will result in a defective electronic device. Typically, components such as the battery connector 50a have been mounted by hand because prior art nozzles were unable to pick up the component or damages the component during pick up, transport or placement. As noted above, hand placement of components suffers from its own deficiencies including slowness, poor quality and costliness.

The nozzle of the present invention solves these pick up, transport and placement problems associated with non-flat topped components. In particular, the pads of the nozzle allow the nozzle to achieve a good vacuum seal with respect to the component such that the component may be readily picked up, transported and placed. The pads fit around or between the topographical features of a non-flat topped component such that the pad holes of the nozzle are pressed against the component to achieve a good vacuum seal so as to apply sufficient vacuum force to pick up, transport and place the component. These same principles of the present invention apply to facilitate the pick up, transport and placement of other components, and in particular, components that are heavy or are wafer shaped.

FIG. 4 illustrates an example of the usefulness of the present invention by reference to the preferred nozzle 10 and the segment of tape 52 including a battery connector 50a housed in a pocket 54a. As the preferred nozzle 10 moves to pick up the battery connector 50a, the pads 20a–c are aligned such that each pad fits between two of the terminals 58a–d of the battery connector 50a. The alignment of the pads between the terminals avoids damage or breakage of the terminals. The alignment also provides the preferred nozzle 10 with good surface contact with the battery connector 50a, thereby facilitating handling of the connector. Further, as the preferred nozzle 10 moves to pick up the battery connector 50a, the nozzle is positioned relative to the battery connector 50a so that the pads 20a–c extend partially into the pocket 54a of the tape 52. The extension of the pads into the pocket allows the pad holes 29a–c to achieve a good vacuum seal with respect to the main body of the battery connector 50a. With the application of the vacuum force, the battery connector 50a is readily lifted out of the pocket 54a, transported and positioned on a circuit board. These same principles of the present invention apply to facilitate the pick up, transport and placement of other components, and in particular, components that are heavy or are wafer shaped.

The preferred embodiment of the present invention has been disclosed by way of example and it will be understood that other modifications may occur to those skilled in the art without departing from the scope and the spirit of the appended claims.

I claim:

1. A nozzle for a mounting head of a component placement machine, comprising:

a positioning block defined by a top and a bottom,
said top of said block having a particular area, and
said bottom of said block having an area that is less than or equal to said particular area;

said block defining a plurality of spaced apart pads on top of said block, each of said pads having a top, and a pad hole in said top or said pad;

said block timer defining an opening in said bottom of said block; and said block defining an interior air passage connecting each of said pad holes with said opening.

2. The nozzle of claim 1, wherein each of said pads has three sides and a substantially flat top.

3. A nozzle for a mounting head of a component placement machine comprising:

a positioning block defined by a top and a bottom;

a plurality of pads disposed on said top of said block, each of said pads having a top and a pad hole in said top of said pad;

an opening in said bottom of said block;

an air passage defined within said positioning block and connecting each of said pad holes with said opening said air passage having
a cross section of a particular area at the intersection of said air passage and one of said pad holes; and
said particular area of said air passage cross section is less than the area of the cross section of said one of said pad holes at said intersection.

4. A nozzle for a vacuum head of a component placement machine, comprising:

a positioning block defined by a top a bottom, and a first side substantially perpendicular to said top and bottom;

a shank connected to said bottom of said block for mounting said nozzle on said vacuum head, said shank having a hollow bore and an outer side; and an air passage defined within said positioning block and connecting each of said pad holes with said hollow bore of said shank.

5. The nozzle of claim 4, wherein said positioning block, said pads and said shank are integrally formed.

6. The nozzle of claim 4, wherein said top of each of said pads is substantially flat.

7. The nozzle of claim 4, wherein said positioning block is further defined by a first side substantially perpendicular to said top and said bottom of said block; and wherein each of said pads has three sides with one of said three sides being a base, and said base being aligned substantially parallel with said first side of said positioning block.

8. The nozzle of claim 7, wherein the other two of said three pad sides are substantially equal in length.

9. The nozzle of claim 7, wherein said base is aligned in the same plane as said first side.

10. The nozzle of claim 7,
wherein each of said three pad sides is substantially perpendicular to said top of said block.

11. The nozzle of claim 7, wherein each of said pads has a top parallel to said top of said block.

12. The nozzle of claim 4,
wherein said air passage has a cross section of a particular area at the intersection of said air passage and one of said pad holes; and
wherein said particular area of said air passage cross section is less than the area of the cross section of said one of said pad holes at said intersection.

13. A nozzle for a vacuum head of a component placement machine, comprising:
a positioning block defined by a top anti a bottom;
a shank connected to said bottom of said block for mounting said nozzle on said vacuum head, said shank having a hollow bore;
a plurality of pads disposed on said top of said block, each of said pads having a pad hole in the top of said pad;
an air passage defined within said positioning block said connecting each of said pad holes with said hollow bore of said shank, said air passage having
a cross section of a particular area at the intersection of said air passage and one of said pad holds, said air passage cross section being round with a particular diameter,
said pad hole cross section being round with a diameter greater than said particular diameter of said air passage cross section, and
said particular area of said passage cross section being less than the area of the cross section of said one of said pad holes at said intersection.

14. A nozzle for a vacuum head of a component placement machine, comprising:
a positioning block defined by a top and a bottom;
a plurality of pads disposed on said top of said block, each of said pads having a top, and a pad hole in said top of said pad;
a shank connected to said bottom of said block for mounting said nozzle on said vacuum head, said shank having a hollow bore; and
an air passage defined within said positioning block and connecting each of said pad holes with said hollow bore of said shank, said air passage having
a cross section of a particular area at the intersection of said air passage and one of said pad holes, said air passage cross section being round with a particular diameter,
said particular area of said air passage cross section being less than the area of the cross section of said one of said pad holes at said intersection, and
said pad hole cross section being oval with at least one diameter greater than said particular diameter of said air passage cross section.

15. A nozzle for a vacuum head of a component placement machine, comprising:

a positioning block defined by a top and a bottom;
a plurality of pads disposed on said top of said block and extending above the surface of said block such that said pads can fit between raised areas of a component to be picked up and placed, each of said pads having a top, and a pad hole in said top of said pad;
a shank connected to said bottom of said block for mounting said nozzle on said vacuum head, said shank having a hollow bore and an outer side, said shank also having a keyway disposed in said outer side of said shank parallel to the longitudinal axis of said shank; and
an air passage defined within said positioning block and connecting each of said pad holes with said hollow bore of said shank.

16. A nozzle for a vacuum mounting head of a component placement machine, comprising:
a positioning block defined by a top, a bottom, and a first side substantially perpendicular to said top and said bottom;
said top of said block further defining a plurality of spaced apart pads, each of said pads having three sides with each of said three sides being substantially perpendicular to said top of said block,
each of said pads having two sides substantially equal in area and having a third side in the same plane as said first side of said positioning block,
each of said pads having a substantially flat top and having a hole in said flat top;
a shank connected to said bottom of said block for mounting said nozzle on said vacuum mounting head, said shank having a hollow bore and an outer side, and a keyway disposed in said outer side of said shank parallel to the longitudinal axis of said shank; and
an air passage defined within said positioning block and connecting each of said pad holes with said hollow bore of said shank, said air passage having a cross section of a particular area at the intersection of said air passage and one of said pad holes, and said particular area of said air passage cross section being less that the area of the cross section of said one of said pad holes at said intersection.

17. A nozzle for a mounting head of a component placement machine, comprising:
a positioning block defined by a top and a bottom;
a plurality of spaced apart pads disposed on said top of said block and extending above the surface of said block such that said pads can fit between raised areas of a component to be picked up and placed, each of said pads having a top, and a pad hole in said top of said pad;
an opening in said bottom of said block; and
an air passage defined within said positioning block and connecting each of said pad holes with said opening.

* * * * *